(12) United States Patent
Geuppert et al.

(10) Patent No.: US 7,581,305 B2
(45) Date of Patent: Sep. 1, 2009

(54) METHOD OF MANUFACTURING AN OPTICAL COMPONENT

(75) Inventors: Bernhard Geuppert, Aalen (DE); Jens Kugler, Heubach (DE); Thomas Ittner, Aalen (DE); Bernd Geh, Scottsdale, AZ (US); Rolf Freimann, Aalen (DE); Guenther Seitz, Spiegelberg (DE); Bernhard Fellner, Aalen (DE); Bernd Doerband, Aalen (DE); Stefan Schulte, Aalen-Waldhausen (DE)

(73) Assignee: Carl Zeiss SMT AG, Oberkochen (DE)

( * ) Notice: Subject to any disclaimer, the term of this patent is extended or adjusted under 35 U.S.C. 154(b) by 370 days.

(21) Appl. No.: 10/821,959

(22) Filed: Apr. 12, 2004

(65) Prior Publication Data

US 2005/0223539 A1 Oct. 13, 2005

(51) Int. Cl.
*G01R 31/28* (2006.01)
(52) U.S. Cl. .............. 29/593; 29/592.1; 29/602.1; 29/833; 29/855; 351/159; 351/177; 356/124; 356/125; 356/127; 356/512; 356/515; 451/6; 451/8; 451/42; 451/43; 451/54
(58) Field of Classification Search .............. 29/592.1, 29/593, 602.1, 833, 835; 351/159, 177; 356/124, 356/125, 127, 512, 515; 451/6, 8, 42, 43, 451/54, 57
See application file for complete search history.

(56) References Cited

U.S. PATENT DOCUMENTS

| | | | |
|---|---|---|---|
| 5,581,347 A | * 12/1996 | Le Saux et al. | 356/124 |
| 6,043,863 A | 3/2000 | Ikeda et al. | |
| 6,229,657 B1 | 5/2001 | Holderer et al. | |
| 6,285,443 B1 | 9/2001 | Wangler et al. | |

(Continued)

FOREIGN PATENT DOCUMENTS

DE 198 25 716 A1 12/1999

(Continued)

OTHER PUBLICATIONS

Don Golini, et al., "Magnetorheological Finishing", Optics & Photonics News, pp. 20-24, Oct. 2001, Optical Society of America.

(Continued)

*Primary Examiner*—Paul D Kim
(74) *Attorney, Agent, or Firm*—Townsend and Townsend and Crew LLP

(57) ABSTRACT

A method of manufacturing an optical component comprising a substrate and a mounting frame with plural contact portions disposed at predetermined distances from each other is provided. The method comprises providing a measuring frame separate from the mounting frame for mounting the substrate, which measuring frame comprises a number of contact portions equal to a number of the contact portions of the mounting frame, wherein respective distances between the contact portions of the measuring frame are substantially equal to the corresponding distances between those of the mounting frame, measuring a shape of the optical surface of the substrate, while the substrate is mounted on the measuring frame, and mounting the substrate on the mounting frame such that the contact portions of the mounting frame are attached to the substrate at regions which are substantially the same as contact regions at which the substrate was attached to the measuring frame.

24 Claims, 6 Drawing Sheets

U.S. PATENT DOCUMENTS

| | | |
|---|---|---|
| 6,441,975 B1 | 8/2002 | Ebert et al. |
| 6,515,750 B1 * | 2/2003 | Malyak et al. ............... 356/512 |
| 6,552,862 B2 | 4/2003 | Dieker |
| 2002/0163741 A1 | 11/2002 | Shibazaki |
| 2002/0176094 A1 | 11/2002 | Petasch et al. |

FOREIGN PATENT DOCUMENTS

| | | |
|---|---|---|
| DE | 101 13 017 A1 | 9/2002 |
| EP | 0 952 490 | 10/1999 |
| EP | 1 209 500 A2 | 5/2002 |
| EP | 1 245 982 A2 | 10/2002 |
| EP | 1 338 911 A | 8/2003 |
| JP | 10 154657 | 9/1998 |
| WO | WO 02/052624 A1 | 7/2002 |

OTHER PUBLICATIONS

Stephan Schulte, et al., "Interferometric Testing Of The VLT Tertiary Mirrors", Proc. SPIE vol. 3745, pp. 14-24, 1999, The International Society for Optical Engineering.

* cited by examiner

METHOD OF MANUFACTURING AN OPTICAL COMPONENT

BACKGROUND OF THE INVENTION

1. Field of the Invention

The present invention generally relates to a method of manufacturing an optical component, a method of manufacturing an optical system as well as an optical system using the same.

2. Brief Description of Related Art

Generally, the quality of optical components making up an optical system largely determines an optical performance that may be achieved with the optical system. High quality optical components are therefore mandatory in the field of precision optics. Especially in the field of photolithography, the trend to ever smaller structures of semiconductors places ever higher demands on the quality of the photolithographic process, and thus the projection exposure apparatus including optical components used in these processes.

Conventionally, manufacturing an optical component for use in an optical system, such as a projection exposure system, is carried out such that a substrate, such as a lens or mirror or the like, is produced, then tested on a suitable test station, potentially changed in terms of optical and geometric properties and finally mounted on a mounting frame to form an optical component for use in an optical system.

Given the ever increasing demands on optical systems, a quality of optical components manufactured using this conventional process has, however, been found to be insufficient at times.

SUMMARY OF THE INVENTION

Therefore, there is a need for a method of manufacturing an optical component and an optical system that allows to produce optical components and optical systems of improved quality.

It has been found that some deterioration of quality of optical components is due to conditions during testing and measuring of the substrate being different from conditions the substrate is exposed to when attached to the mounting frame and/or other components in an optical system.

In particular, it has been found that, for instance for large diameter optical lenses, such as those used in projection exposure systems, the influence of gravity may become of significance. In particular, a substrate such as a lens may deform during use in an optical system due to its relatively large weight under the influence of gravity thus decreasing an overall quality of the optical component. Since during testing, the substrate would generally be held in a different position and/or manner from that during use in an optical system, an influence of gravity would be different during the testing. Attempts have been made to compensate for this effect by computer simulations that take account of the expected deformation when testing and changing a geometric shape of the substrate. However, a method that matches the real operating conditions, i.e. conditions during use in an optical system, even more closely would be highly desirable.

In addition, the way the substrate is mounted on the mounting frame may influence properties of the substrate. For instance, tensions and deformations may be induced in the substrate as a result of mechanically mounting the substrate, which tensions or deformations may have a detrimental effect on optical properties of the substrate. Since this effect depends on a number of factors such as the particular mounting mechanism, the number of contact points between the mounting frame and the substrate, etc., it will generally not be a constant and foreseeable quantity that could appropriately be accounted for using computer simulations.

In response to the above-mentioned needs, the present invention generally provides an alternative method of manufacturing an optical component and manufacturing an optical system, as well as an optical component and optical system manufactured thereby.

Broadly speaking, an improved method for manufacturing an optical component/optical system as provided according to the present invention comprises measuring or testing an optical surface of a substrate (or other suitable parameter of the substrate) while the substrate is mounted to a frame, which may be either the mounting frame used for mounting the substrate and assembling the optical component in the optical system or a suitable measuring frame. This allows to match the conditions the substrate is experiencing when in use in an optical system more closely to the conditions during the measuring/testing and therefore allows to manufacture optical components and systems of higher quality.

An optical component, as used herein, comprises a substrate and a mounting frame for mounting the substrate. The substrate has at least one optical surface, and may be any optical element known in the art, such as an optical lens element, for instance in form of a cylindrical lens, an axicon, or a light homogenising glass rod, or may be a mirror or mirror array, or the like. The optical surface of the substrate may be aspherical or spherical, for instance.

An optical system, as used herein, comprises a plurality of optical components. A projection exposure system is an example of such an optical system. The term optical system as used herein may relate to an entire optical apparatus comprising substantially all components required for the system to be ready for use in a designated process, such as a whole projection exposure system, or it may relate to a part or sub-unit of an optical apparatus, comprising plural optical components. A projection optical system is a sub-unit of a projection exposure system, namely the part of a projection exposure system which transfers an image of a reticle (or other patterning structure) onto a substrate in a photolithographic process, and would be another example of an optical system.

The term frame is used herein to describe a frame used for mounting/holding a substrate and encompasses both mounting and measuring frames. A variety of frames and corresponding mounting mechanisms is known in the art. A mounting frame, as used herein, generally serves to hold a substrate, most preferably in a particular position, when the optical component is assembled in an optical system.

Generally, contact portions of the frame provide a contact or a connection to contact regions of the substrate, which are, in general, situated on a peripheral ring of the substrate. The contact portions may be continuous or discontinuous, i.e. may be in the form of a continuous ring or in the form of discrete contact portions. Generally, any region of a substrate, which region would generally be situated on a peripheral zone of the substrate, may serve as a contact region.

A contact or connection between a contact portion of the frame and a contact region of the substrate may be effected by a number of different mounting (or holding) mechanisms, such as by clamping, screwing, glueing, wringing, soldering, or welding the substrate and the mounting frame together, or a combination of any two or more thereof. The particular method of mounting used may be chosen in dependence of requirements of a particular application and/or manufacturing criteria, for instance, the use of an adhesive would depend on the compatibility of the particular adhesive with a potentially following coating process.

The frame may comprise areas or markers configured to help mounting the frame in a defined position in an optical system or in a measuring set-up, for instance.

In a first aspect, the present invention provides a method of manufacturing an optical component, with the optical component comprising a substrate having an optical surface and a mounting frame for mounting the substrate, the mounting frame comprising plural contact portions for providing a mounting contact between the mounting frame and the substrate, wherein the plural contact portions of the mounting frame are disposed at predetermined distances from each other. The method according to the first aspect of the invention comprises:

(i) providing a measuring frame separate from the mounting frame for mounting the substrate, wherein the measuring frame comprises plural contact portions for providing a mounting contact between the measuring frame and the substrate, wherein a number of the contact portions of the measuring frame is equal to a number of the contact portions of the mounting frame, and wherein respective distances between the contact portions of the measuring frame are substantially equal to the corresponding distances between the contact portions of the mounting frame;

(ii) measuring a shape of the optical surface of the substrate, while the substrate is mounted on the measuring frame such that the contact portions of the measuring frame are in contact with the substrate at respective contact regions of the substrate;

(iii) processing the optical surface of the substrate; and (iv) mounting the substrate on the mounting frame such that the contact portions of the mounting frame are attached to the substrate at regions which are substantially the same as the contact regions at which the substrate was attached to the measuring frame.

As an alternative to or in addition to measuring a shape of the optical surface of the substrate, any other geometric or optical parameter of the substrate may be measured, such as refractive index homogeneity, birefringence, or the like.

Using this method allows to match measuring conditions more closely to the conditions during use of the optical component in an optical system, in particular tensions introduced into the optical component by the mounting itself, which allows to obtain measuring results that better represent optical and geometric properties of the substrate in the optical element during use. This, in turn, allows more accurate processing of the substrate which then allows to achieve an improved overall quality of the optical component and optical system comprising the optical element.

The processing of the optical surface in the method of manufacturing an optical component, as described above, may be carried out while the substrate is mounted on the measuring frame. In particular, the substrate may remain permanently mounted to the measuring frame during measuring and processing.

In preferred embodiments of the first aspect of the present invention, the number of the contact portions of the mounting frame is three. This embodiment is particularly advantageous since the waviness of the optical surface of the substrate resulting from providing contact at three contact portions may easily be removed by polishing. In other embodiments, the number of contact portions may be higher than three. In further embodiments, the mounting frame may provide the contact portions in the shape of a substantially continuous contact ring, so that a contact or connection between the substrate and the mounting frame extends over a substantially continuous peripheral contact region or contact rim, respectively.

The contact portions of the mounting frame may have a configuration that is substantially the same as a configuration of the contact portions of the measuring frame, in particular in terms of size, mounting mechanism, and structure. For instance, the contact portions of the measuring frame and the mounting frame could be provided as bipods, preferably the same bipods in terms of dimensions and functional properties.

Preferably, mounting and measuring frames used in the practice of the present invention have a configuration that will keep influences exerted onto the mounted substrate by the mounting frame or measuring frame itself and potential adjacent components constant. For instance, tensions introduced into the substrate by the particular mounting mechanism should preferably be "frozen" once the substrate is mounted to the mounting/measuring frame and thus remain constant and reproducible during measuring, and optionally processing, of the optical surface of the substrate, as well as during use in an optical system. Preferably also, the mounting mechanism employed will allow for thermal expansion or shrinkage of the substrate without a simultaneous change or creation of tension or deformation or the like in the substrate. Even more preferably, the frame is of such a configuration that tilting of the substrate or the like during use in an optical system does not create or increase significant tensions or deformations or the like in the substrate.

In a second aspect, the present invention provides a method of manufacturing an optical component, the optical component comprising a substrate having an optical surface, and a mounting frame for mounting the substrate, which comprises:

(i) assembling the optical component by mounting the substrate on the mounting frame;

(ii) measuring a shape of the optical surface of the substrate; and (iii) processing the optical surface of the substrate;

wherein the substrate is mounted on the mounting frame during the measuring of the shape of the optical surface and the processing of the optical surface of the substrate.

Again, as an alternative to or in addition to measuring a shape of the optical surface of the substrate, any other geometric or optical parameter of the substrate may be measured, such as refractive index homogeneity, birefringence or the like. In an exemplary embodiment, it may be advantageous to measure the degree to which the substrate is centered inside the frame, as an alternative or in addition to measuring the shape of the optical surface or other parameter of the substrate.

In exemplary embodiments, the substrate remains permanently mounted on the mounting frame during the measuring of the shape of the optical surface (or other parameter) and the processing of the optical surface. Those embodiments are advantageous in that potential influences exerted onto the substrate, such as tensions or deformations, would be expected to remain substantially constant during measuring and processing the optical component as well as using the optical component in an optical system, since the substrate remains mounted to one frame. Properties determined by measuring the optical surface (or other parameter) of the substrate should therefore closely match the properties of the substrate when under influences that the mounted substrate encounters when assembled in an optical system, with advantages for the processing accuracy etc. resulting therefrom, as already discussed before. The better the frame is at keeping those influences constant throughout the method of manufacturing, the better the resulting quality would be expected to be.

In exemplary embodiments of the present invention according to the second aspect, the mounting frame comprises more than three contact portions for providing a mounting contact between the mounting frame and the substrate. The contact portions of the mounting frame may be disposed at distances from each other, or a continuous contact portion in the shape of a contact ring may be used, in which case the distances between contact portions would be zero or practically zero.

In exemplary embodiments of the present invention, the optical component is designed for being used in an particular optical system, and the mounting frame of the optical component may be designed to be mounted to at least one adjacent mounting frame. In those embodiments, the method may further comprise mounting the mounting frame to the at least one adjacent mounting frame and measuring the shape of the optical surface (or other parameter) of the substrate while the mounting frame is mounted to the at least one adjacent mounting frame. Thus, the mounting frame may be mounted to one adjacent frame, or to one adjacent frame on either side, or to one adjacent frame, which, in turn, may be mounted to a further frame. Those embodiments are advantageous in that, for instance, deformations or tensions or the like that are generated in the substrate or optical component during use in an optical system as a result of being connected to an adjacent frame are already present during the measuring process, and optionally processing of the optical surface of the substrate, thus leading to better measuring results, and so forth, as explained before. These embodiments would also be suitable in connection with the method according to the first aspect of the present invention and the embodiments described in connection therewith.

In exemplary embodiments of the present invention, the optical component is designed for being mounted in an optical system such that the substrate has a predetermined orientation with respect to a direction of gravity, and the measuring of the shape of the optical surface (or other parameter) of the substrate is performed while the substrate is disposed in an orientation with respect to the direction of gravity which is substantially the same as the predetermined orientation.

In exemplary embodiments of the method according to the first and second aspect of present invention, the method further comprises determining differences between the shape of the optical surface and a target shape thereof and the processing of the optical surface is carried out in dependence of the determined differences. If one or more parameters of the substrate are measured which are not the shape of the optical surface, the method, accordingly, comprises determining differences between a value of the measured parameter and a target value thereof and the processing of the optical surface is carried out in dependence of the determined differences.

The distortion of a substrate such as a lens element due to the influence of gravity, for instance, may lead to a distribution and thus an inhomogeneity of refractive indices in the lens material induced by tensions within the lens material. This distribution of refractive indices may be measured and then compensated for by processing the lens element, and in particular by a suitable coating disposed on a surface of the lens element.

In embodiments where spherical lens elements are used as substrates, it may be advantageous to measure the radii of the optical surfaces since the radii form a substantial part of a Petzval sum of an optical system the spherical lens will be used in and thus a significant factor of the overall optical performance.

The measuring of the shape of the optical surface of the substrate or other parameter of the substrate may be carried out by any known method, such as interferometric measurement, measurement involving tactic coordinates, measurement involving pattern projection, or a combination of any two or more of the above, or the like. When using measuring techniques using a measuring beam, such as in interferometric techniques, measuring may be carried out in a reflection mode or a mode where the measuring beam passes through two optical surfaces of the substrate, such as a lens. In those embodiments, it may be advantageous when the measuring beam is adapted to have at least one of substantially the same wavelength, intensity, and frequency, as a beam used in an optical system that the optical element is designed to be used in.

In a third aspect, the present invention provides a method of manufacturing an optical component, the optical component comprising at least two substrates having at least one optical surface each and a mounting frame for mounting the at least two substrates, the method comprising:

(i) assembling the optical component by mounting the at least two substrates on the mounting frame;

(ii) measuring an optical property of the at least two substrates while the at least two substrates are mounted on the mounting frame and using a measuring beam which passes through two optical surfaces of at least one of the at least two substrates; and (iii) processing the optical surface of at least one of the at least two substrates, wherein the processing of the optical surface is carried out while the at least two substrates remain permanently mounted on the mounting frame.

Thus, rather than measuring only one substrate, at least two substrates which are mounted on a mounting frame are measured for assessment of their optical properties. For measuring their optical properties, it is generally necessary to use a measuring set-up based on a method wherein a measuring beam passes through the substrates, i.e. passes through both optical surfaces of at least one substrate. If two substrates are used, it would be conceivable that the measuring beam is reflected on an optical surface of the second substrate, after having passed through two optical surfaces of the first substrate.

The measuring of the optical property of the substrates may be carried out by any suitable known method, such as interferometric measurement, for instance. As mentioned before, it may be advantageous to adapt a measuring beam used when measuring to have at least one of substantially the same wavelength, intensity, and frequency, as a beam used in an optical system that the optical element is designed to be used in. Optical property encompasses any property of the substrate(s) that is suitable for characterising an optical performance thereof.

In exemplary embodiments of the method according to the third aspect of present invention, the method further comprises determining differences between the optical property of the substrates and a target optical property thereof and the processing of the optical surface or optical surfaces is carried out in dependence of the determined differences.

In further exemplary embodiments of the present invention according to the third aspect, the optical component is designed for being mounted in an optical system such that the substrates have a predetermined orientation with respect to a direction of gravity, and the measuring of the optical property or properties of the substrates is performed while the substrates are disposed in an orientation with respect to the direction of gravity which is substantially the same as the predetermined orientation.

The processing of the optical surface of the substrate or substrates in the methods of the present invention may be carried out by any known process, such as magneto-rheological fluid processing, ion beam processing, fluid jet processing, chemical and/or mechanical polishing, etching, milling, grinding, hot or cold coating processes, a combination of any two or more of the above, or the like.

Optionally, the optical surfaces of the substrate (s) may be cleaned after at least one of the measuring and the processing. Accordingly, frames and mounting mechanisms that allow for a cleaning step to be carried out are used in those exemplary embodiments.

The present invention, in a fourth aspect, provides a method of manufacturing an optical system having plural optical components, wherein at least one optical component of the plural optical components is manufactured according to the method according to the first, second or third aspect of the present invention, wherein the method according to the fourth aspect comprises assembling the plural optical components to form the optical system. The embodiments discussed in connection with the first to third aspects of the present invention are equally applicable in the practice of the method according to the fourth aspect.

In a fifth aspect, the present invention provides a method of manufacturing an optical system having plural optical components, the method comprising manufacturing at least one optical component of the plural optical components in accordance with the method according to the first, second or third aspect of the present invention, wherein the method further comprises assembling the plural optical components to form the optical system. The embodiments discussed in connection with the first to third aspects of the present invention are equally applicable in the practice of the method according to the fifth aspect.

In exemplary embodiments of the present invention, the optical component is an optical component for use in a projection exposure system and the optical system is a projection exposure system. The projection exposure system may be catoptric, catadioptric or dioptric, for instance.

In a sixth aspect, the present invention relates to an optical component manufactured according to the method of manufacturing an optical component in accordance to the first, second or third aspect of the present invention. In a seventh aspect, the present invention also relates to an optical system manufactured by the method in accordance with the fourth or fifth aspect of the present invention. The embodiments discussed in connection with the respective aspect(s) of the present invention are equally applicable in the practice of the invention according to the sixth and seventh aspect.

BRIEF DESCRIPTION OF THE DRAWINGS

The forgoing as well as other advantageous features of the invention will be more apparent from the following detailed description of exemplary embodiments of the invention with reference to the accompanying drawings, wherein.

DETAILED DESCRIPTION OF EXEMPLARY EMBODIMENTS

Figure 1:
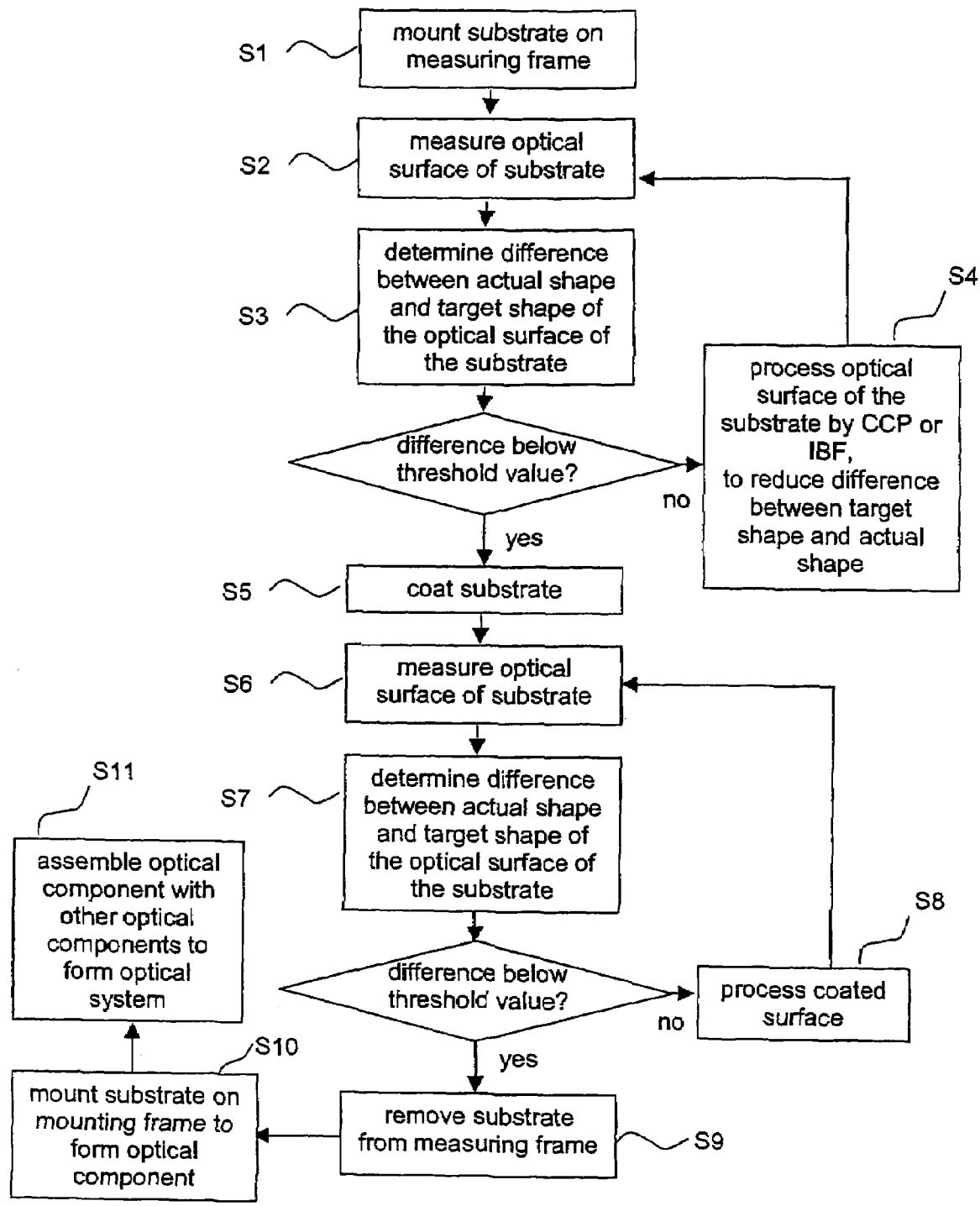
FIG. 1 shows a flow chart of an embodiment of the method of manufacturing an optical component and optical system according to the present invention.

In FIG. 1, a flow diagram of an embodiment of the method of manufacturing an optical component and optical system is shown. As a first step (S1), a substrate, such as a lens, is mounted on a measuring frame. In this embodiment, contact between contact portions of the measuring frame and contact regions of the substrate is established by a clamping mechanism. Subsequently, the optical surface of the substrate is measured by an interferometric technique (S2). A difference between a predetermined target shape of the optical surface and an actual shape of the optical surface is determined in a subsequent step (S3). If the difference is below a predetermined threshold value, the substrate is coated in a further step (S5) whilst mounted to the measuring frame. If the difference is above the threshold value, however, the optical surface of the substrate is processed by computer-controlled polishing of IBF in order to change a shape of the optical surface to be closer to a target shape in a separate step (S4). The shape of the optical surface is measured again (S2) and the difference between the actual shape and the target shape determined again (S3). If the difference between the actual shape and the target shape is still above the predetermined threshold value, the processing and measuring are repeated until the difference falls below the threshold value and the substrate can be coated. Once the substrate has been coated, a shape of the optical surface of the substrate is measured (S6) and a difference between a target shape and an actual shape of the optical surface determined (S7). In analogy to the above, if the difference is above a predetermined threshold value, the coated surface is processed (S8) and the shape of the optical surface measured again (S6, S7) until the difference falls below a predetermined threshold value. Once the difference between the target shape and the actual shape of the optical surface is below a predetermined threshold value, the substrate is removed from the measuring frame (S9) and mounted on the mounting frame (S10) to form the optical component. In this embodiment, as with other embodiments described herein, the mounting of the substrate to the mounting frame can be carried out such that the contact portions of the mounting frame are attached to the substrate at contact regions that are substantially the same to the contact regions at which the substrate was attached to the measuring frame, i.e., a given contact region of the substrate associated with the mounting frame at least overlaps a corresponding contact region of the substrate associated with the measuring frame. Preferably, the contact regions of the substrate are the same to within normal tolerances when the substrate is mounted on the measuring frame as compared to when the substrate is mounted on the mounting frame. Alternatively, as with other embodiments described herein, it is possible for the contact regions associated with the mounting frame to be displaced somewhat from the corresponding contact regions associated with the measuring frame, e.g., to be displaced within ¼, ⅕, 1/10 or 1/20 the distance between adjacent contact regions. In this particular embodiment, as with other embodiments described herein, the mounting frame can have the same configuration as the measuring frame, in particular the same configuration of contact portions in terms of number of contact portions, spacing, size, mounting mechanism and structure. For instance, for both the measuring and the mounting frame, the frame depicted in FIG. 5 may be used. Respective distances between the contact portions of the measuring frame can be substantially equal to the corresponding distances between the contact portions of the mounting frame, i.e., such distances are equal to within at least a width of such contact portions (e.g., a width of lugs 141 illustrated in FIG. 4 or a width of attachment pads 253 as illustrated in FIG. 5). Preferably, respective distances between the contact portions of the measuring frame are equal to the corresponding distances between the contact portions of the mounting frame to within normal tolerances. In a last step (S11), the optical component is assembled with other optical components to form the optical system.

In an alternative embodiment of the process shown with reference to FIG. 1, the substrate may be removed from the measuring frame before being coated and mounted to the mounting frame after being coated. In a still further alternative embodiment, the substrate may be removed from the measuring frame and mounted on the mounting frame before the coating process.

Figure 2:
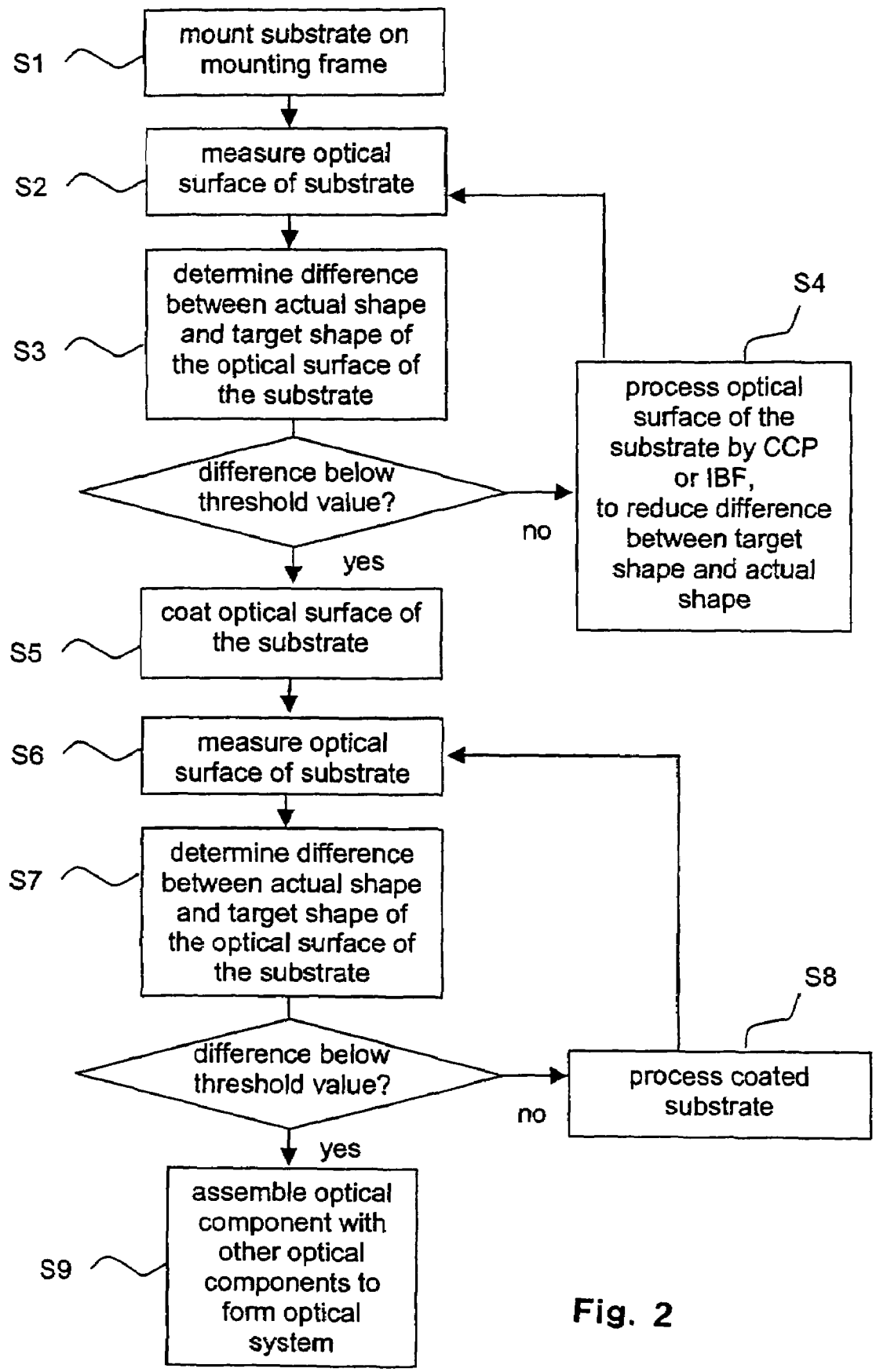
FIG. 2 shows a flow chart of a further embodiment of the method of manufacturing an optical component and optical system according to the present invention.

In FIG. 2, a further embodiment of the present invention is depicted. In this embodiment, in a first step (S1), the substrate is mounted on the mounting frame, i.e. the frame that also holds the substrate when the optical component is assembled in an optical system. A shape of the optical surface of the substrate is measured interferometrically in a second step (S2) while the substrate remains mounted to the mounting frame. Subsequently, a difference between a target shape of the optical surface of the substrate and a target shape thereof are determined (third step S3). If the difference is above the predetermined threshold value, the optical surface is processed to reduce the difference between the target shape and the actual shape (S4). After the processing, the shape of the optical surface is measured again (S2), differences between the target shape and the actual shape are determined (S3) and, if necessary, the processing and measuring inclusive of determining differences (S4, S2, S3) repeated until the difference falls below the threshold value. Once the difference between the target shape and the actual shape of the optical surface are acceptable, the substrate is coated (in step S5), whilst still being mounted on the mounting frame. After the coating process, the optical surface is measured again (S6) and a difference between the actual shape of the coated optical surface and a target shape thereof determined (S7). If a difference between an actual shape of the optical surface and target shape is higher than a predetermined threshold value, the coated optical surface is processed until the difference between a target shape and the actual shape is acceptable, in analogy to the measuring-determining-processing-cycle (S2, S3, S4) described above. Once the coated substrate fulfils predetermined requirements, the optical component, which includes the substrate and the mounting frame, is assembled with other components to form the optical system (S9).

Optionally, in the process described above, the mounting frame may be mounted to one or two adjacent frames, i.e. frames that are designed to be mounted to the optical component when used in the optical system.

Figure 3:
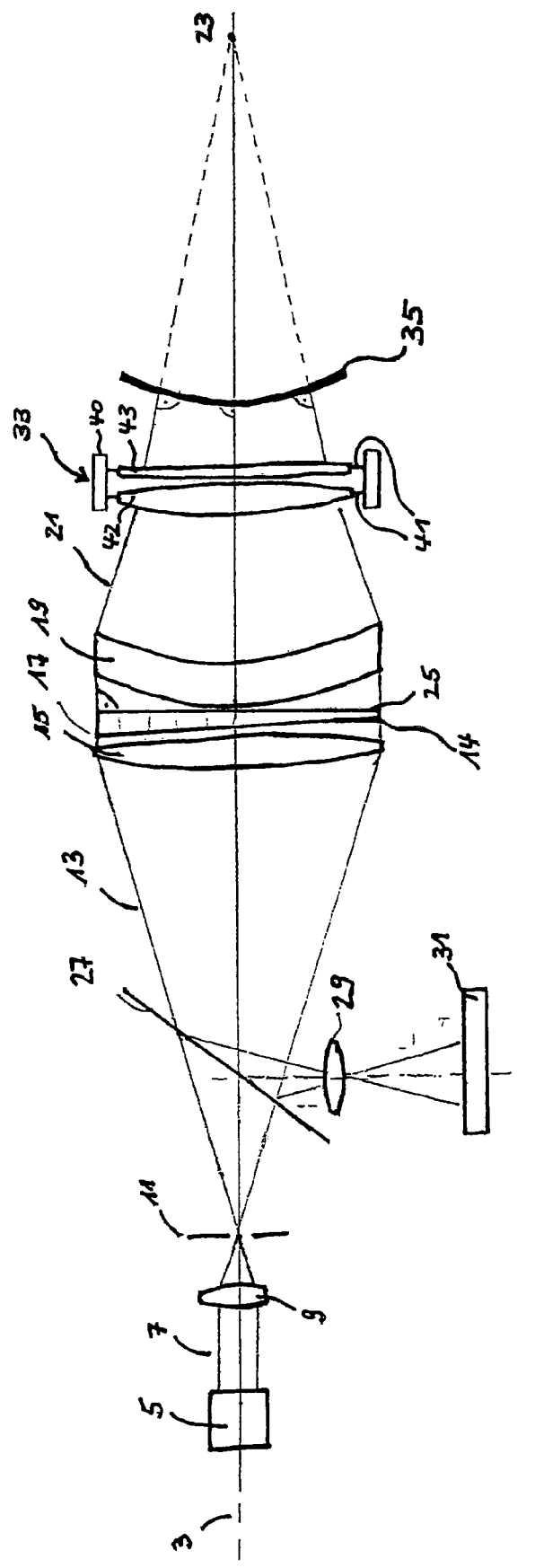
FIG. 3 schematically illustrates measuring of an optical property of two substrates mounted on a mounting frame in the method according to the present invention.

In FIG. 3, a setup for interferometric measuring of an optical property of two transparent optical lenses, i.e. two substrates, mounted to a mounting frame, is depicted. This measurement set-up may be used in a process as described in the embodiment of the method depicted in FIG. 2. A conventional instrument and method for qualifying a convex optical surface, for instance, that may be used for measuring the two lenses will be illustrated with reference to FIG. 3. The depicted interferometer set-up is a Fizeau type interferometer having an optical axis 3 and a laser light source 5 such as a Helium-Neon-gas laser, emitting a laser beam 7. A microobjective 9 collimates laser beam 7 onto a pinhole of a spatial filter 11 such that a diverging beam 13 originates from the pinhole of spatial filter 11. A collimating lens 15 or a similar arrangement of plural lenses collimates diverging beam 13 to form a parallel beam 17. Wavefronts in parallel beam 17 are substantially flat wavefronts.

A surface 25 of wedge-shaped plate 14 forms a reference surface of the Fizeau interferometer. Surface 25 is partially reflective, and wavefronts of beam 17 are partially reflected from surface 25 such that they travel back in the beam path of the interferometer. A partially transmissive mirror 27 is arranged in the beam path of diverging beam 13 such that wavefronts reflected from reference surface 25 are imaged by a camera lens 29 onto a light sensitive substrate of a camera 31.

A collimating lens 19 or similar collimating arrangement of plural lenses transforms parallel beam 17 into a converging beam 21 such that a crossover of converging beam 21 is formed in a region 23 on optical axis 3. Wavefronts in converging beam 21 are substantially spherical wavefronts.

Two lenses 42, 43 comprised in optical component 33 have optical surfaces to be measured. Optical component 33 comprises a frame 40, and a plurality of lugs 41 on an inside of the frame 40 for providing contact between frame 40 and lenses 42, 43 so as to hold the lenses 42, 43 in place. The lenses may be attached to the plurality of lugs 41 by any known suitable method, such as by use of an adhesive, screwing, clamping, wringing, soldering or the like. Optical component 33 is arranged in the beam path of converging measuring light beam 21 such that the optical surfaces of the lenses face interferometer optics comprising lenses 15 and 19 as well as plate 14. The wavefronts of measuring light beam 21 travel through the optical surfaces of the two lenses of optical component 33 and are then incident on convex mirror 35 under a right angle. The incident wavefronts are reflected back through the two lenses of optical component 33 to the interferometer optics, travel through the interferometer optics and are imaged by camera 31. On camera 31 the wavefronts reflected back from reference surface 25 and the wavefronts that have passed through the lenses of optical component 33 and are reflected back from mirror 35 are superimposed and form interference fringes which are detected by camera 31. From a measurement of such interference fringes, deviations of the optical surfaces from their target shapes or target optical property may be determined. Based on such a determination, one or both of the optical surfaces may be processed so as to match a target shape or target optical property more closely in the method according to the present invention.

Figure 4:
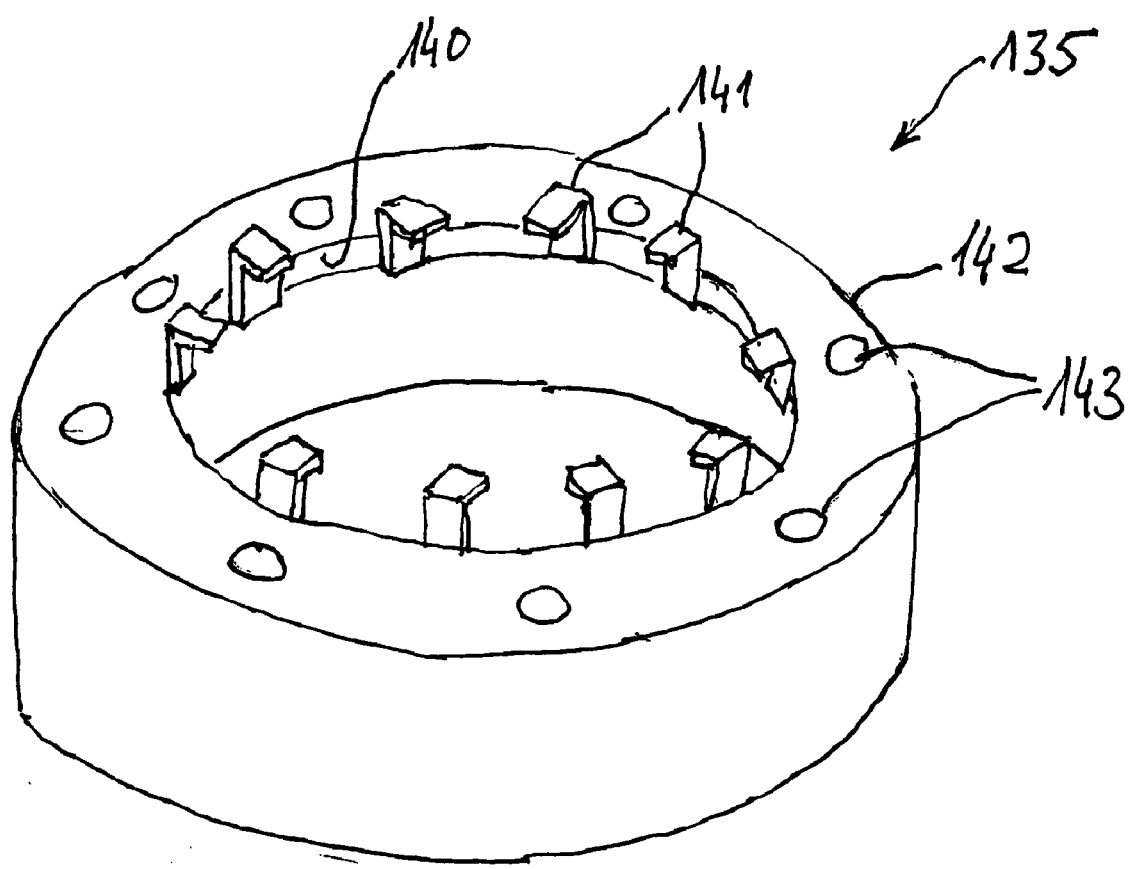
FIG. 4 depicts a mounting frame suitable for use with the method according to the present invention.
Figure 5:
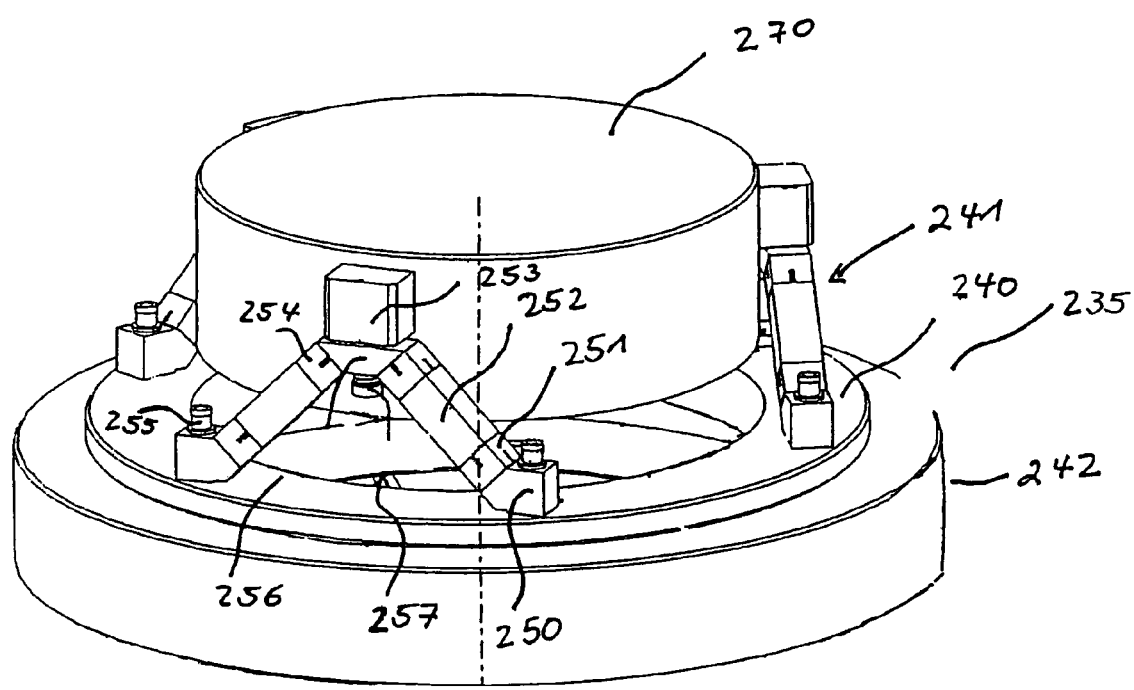
FIG. 5 depicts a further mounting frame suitable for use with the method according to the present invention.

FIG. 4 depicts a frame suitable for use with the present invention. The frame could, for instance be used as the mounting frame in the process described with reference to FIG. 2. Frame 135 comprises a plurality of lugs 141, an inner ring 140, and a housing 142. Lugs 141 are provided in the form of L-shaped spring joints and are distributed equidistantly along the circumference of inner ring 140. A substrate (not shown), such as an optical lens, can be attached to the lugs 141 by an adhesive and coupled by the lugs 141 to the inner ring 140 and thus the housing 142. Inner ring 140 and housing 142 may be formed from one piece or may be made from two separate, connected pieces. The spring joints used as the lugs allow to mount the substrate with little or no tension to the frame 135.

On a peripheral edge of housing 142, a number of holes 143 are provided to allow frame 135 to be mounted to adjacent frames. A frame employing such a lug arrangement is described in detail in U.S. Pat. No. 6,229,657 to the same assignee, the entire contents of which is incorporated by reference herein.

In FIG. 5, an alternative frame 235 suitable for use with the present invention is depicted. The frame is particularly advantageous when used as a mounting frame and a measuring frame in the embodiment of the method of the present invention described with reference to FIG. 1. Frame 235 is shown with substrate 270 mounted thereto. Substrate 270 is a mirror. Three contact portions 241 are attached to and provide contact to mirror 270. The contact portions 241 are distributed equidistantly around an inner ring 240 of frame 235. A bipod arrangement is used for each of the contact portions 241. Each bipod arrangement comprises two base sections 250 which are screwed to inner ring 240 by means of screws 255. Two bipod arms 252 are each movably connected to base sections 250 by means of flexible joints 251 and to common top part 256 by flexible joints 254. An attachment pad 253 is fastened to top part 256 by means of screw 157. The attachment pad is glued to a side of mirror 270. The bipod arms 252 allow to mount mirror 270 to frame 235 with relatively little tension and allow for great flexibility of movement and thermal expansion of the mirror 270 without inducing additional tensions in the mirror 270. Inner ring 240 may be integrally formed with housing 242 or provided as a separate piece and subsequently fastened to housing 242.

Figure 6:
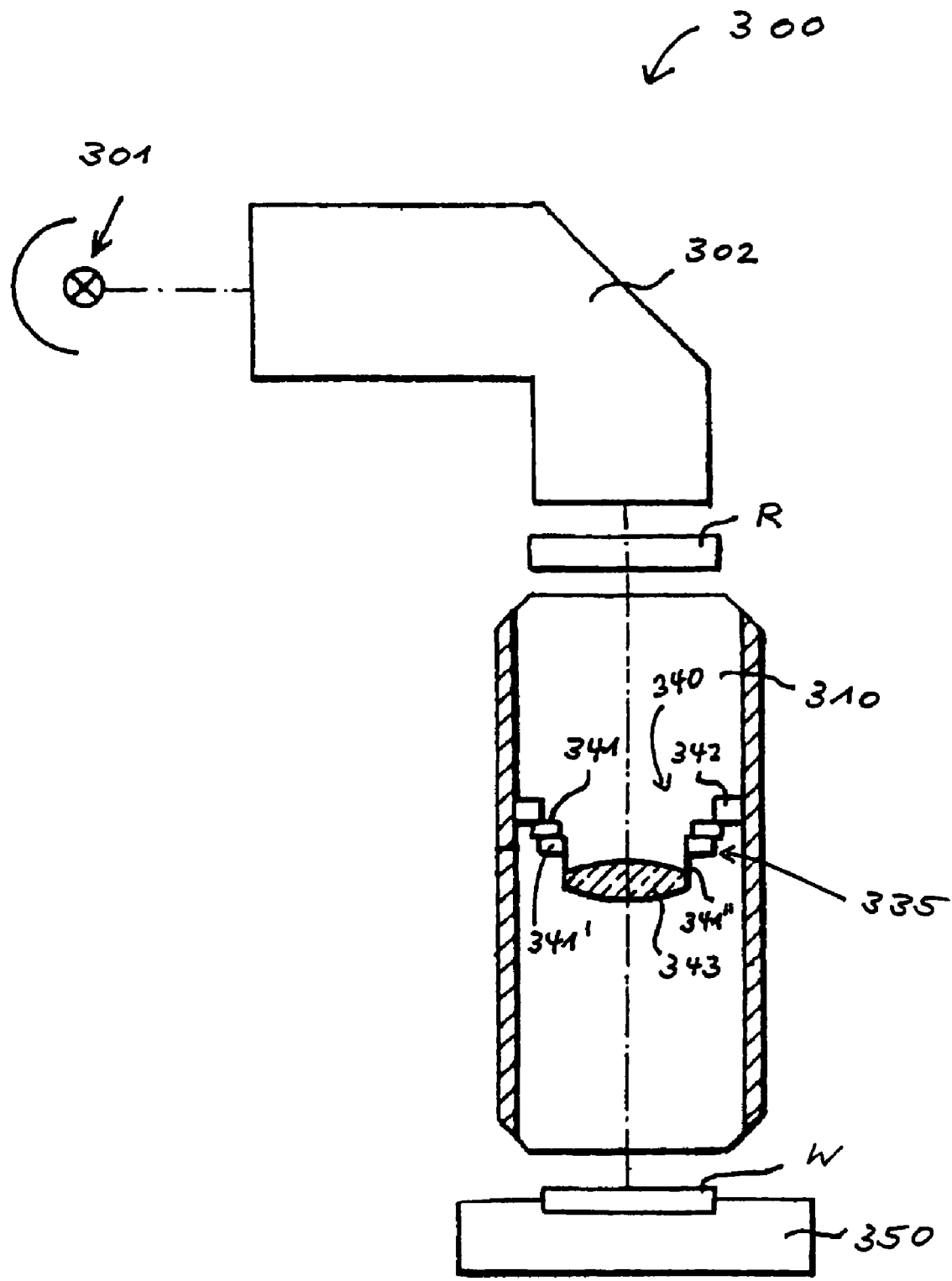
FIG. 6 shows an embodiment of an optical system according to the present invention.

In FIG. 6, a projection exposure system is depicted as an embodiment of an optical system in accordance with the present invention. Projection exposure system 300 comprises a light source 301 and an illumination optical system 302, which together form a beam delivery system. The beam delivery system may, for instance be the one described in U.S. Pat. No. 6,285,443. The beam delivery beam provides a light beam for illuminating a predetermined region of a reticle R. The projection exposure system further comprises a projection optical system 310 and a wafer stage 350. An image of the illuminated region of the reticle R is projected by the projection optical system 310 onto an exposure field on a wafer W, which wafer is held by a wafer stage 350, for exposing the wafer W. Projection optical system 310 comprises a plurality of optical components, one of which is schematically depicted as optical component 335. Optical component 335 comprises lens 343 as a substrate and frame 340, which frame 340 comprises a ring-shaped frame portion 342 for mounting the frame 340 within the projection optical system 310 and a plurality of contact portions consisting of three members 341, 341', 342' for providing contact between the lens 343 and the ring-shaped frame portion 342. In this embodiment, the lens 343 is attached to members 341" of the contact portions by an adhesive. The projection exposure system 300 may be dioptric or catadioptric, for instance. In other embodiments of the present invention, catoptric systems may be used.

Although illustrated and described above with reference to specific embodiments, the present invention is not to be construed as being limited to the details of these embodiments. Rather, various modifications will be apparent to those skilled in the art which are equivalents of the subject-matter as claimed and thus do not depart from the scope of the present invention as given by the appended claims.

What is claimed is:

1. A method of manufacturing an optical component, the optical component comprising a substrate having an optical surface, and a mounting frame for mounting the substrate, the method comprising:

assembling the optical component by mounting the substrate on the mounting frame, the mounting frame comprising a support member and plural attachment members, the support member having a structure of a closed ring, the plural attachment members being connected to the support member at plural locations on the support member and separated from one another, the substrate being mounted to the mounting frame via the plural attachment members such that an optical axis of the substrate is positioned inside the closed ring;

measuring a shape of the optical surface of the substrate; and physically processing the optical surface of the substrate such that the optical surface is modified by said processing;

wherein the substrate is mounted on the mounting frame including the support member during the measuring of the shape of the optical surface and the processing of the optical surface.

2. The method according to claim 1, wherein the substrate remains permanently mounted on the mounting frame during the measuring of the shape of the optical surface and the processing of the optical surface.

3. The method according to claim 1, wherein the mounting frame comprises more than three attachment members.

4. The method according to claim 1, wherein the mounting frame of the optical component is designed to be mounted to at least one adjacent mounting frame in an optical system, the method further comprising mounting the mounting frame to the at least one adjacent mounting frame and measuring the shape of the optical surface of the substrate while the mounting frame is mounted to the at least one adjacent mounting frame.

5. The method according to claim 1, further comprising determining differences between the shape of the optical surface and a target shape thereof, wherein the processing of the optical surface is carried out in dependence of the determined differences.

6. The method according to claim 1, wherein the optical component is designed for being mounted in an optical system such that the substrate has a predetermined orientation with respect to a direction of gravity, and wherein the measuring of the shape of the optical surface of the substrate is performed while the substrate is disposed in an orientation with respect to the direction of gravity which is substantially the same as the predetermined orientation.

7. The method according to claim 1, wherein the processing of the optical surface is carried out by at least one of magneto-rheological fluid processing, ion beam processing, fluid jet processing, chemical and/or mechanical polishing, etching, milling, grinding, and hot or cold coating processes.

8. The method according to claim 1, wherein the measuring of the shape of the optical surface is carried out by at least one of interferometric measurement, measurement involving tactic coordinates, and measurement involving pattern projection.

9. The method of claim 1, wherein the mounting frame is configured to support the substrate in an optical system for which the optical component is designed.

10. The method of claim 1, wherein the closed ring has a circular shape.

11. The method of claim 1, wherein the support member comprises a continuous member that supports the plural attachment members.

12. A method of manufacturing an optical system having plural optical components, wherein at least one optical component of the plural optical components comprises a substrate having an optical surface, and a mounting frame for mounting the substrate, the method comprising:

assembling the at least one optical component by mounting the substrate on the mounting frame, the mounting frame comprising a support member and plural attachment members, the support member having a structure of a closed ring, the plural attachment members being connected to the support member at plural locations on the support member and separated from one another, the substrate being mounted to the mounting frame via the plural attachment members such that an optical axis of the substrate is positioned inside the closed ring;

measuring a shape of the optical surface of the substrate; and physically processing the optical surface of the substrate such that the optical surface is modified by said processing;

wherein the substrate is mounted on the mounting frame including the support member during the measuring of the shape of the optical surface and the processing of the optical surface;

the method further comprising assembling the plural optical components to form the optical system.

13. The method of claim 12, wherein the mounting frame is configured to support the substrate in an optical system for which the optical component is designed.

14. A method of manufacturing an optical component, the optical component comprising a substrate and a mounting frame for mounting the substrate, the substrate having an optical surface, the method comprising:

mounting the substrate on the mounting frame, the mounting frame comprising a support member and plural attachment members, the plural attachment members being connected to the support member at plural locations on the support member, the support member having a structure of a closed ring, the plural attachment members being separated from one another along a circumference associated with said ring shape, the substrate being mounted to the mounting frame via the plural attachment members such that an optical axis of the substrate is positioned inside the closed ring;

measuring a shape of the optical surface of the substrate while the substrate is mounted on the mounting frame including the support member; and physically processing the optical surface of the substrate while the substrate is mounted on the mounting frame such that the optical surface is modified by said processing.

15. The method of claim 14, wherein the mounting frame is configured to support the substrate in an optical system for which the optical component is designed.

16. The method of claim 14, wherein the closed ring has a circular shape.

17. The method of claim 14, wherein the support member comprises a continuous member that supports the plural attachment members.

18. A method of manufacturing an optical component, the optical component comprising a substrate and a mounting frame for mounting the substrate, the substrate having an optical surface, the method comprising:

mounting the substrate on the mounting frame, the mounting frame comprising a support member and plural attachment members, the support member having a structure of a closed ring, the plural attachment members being connected to the support member at plural locations on the support member and separated from one another, the substrate being mounted to the mounting frame via the plural attachment members such that an optical axis of the substrate is positioned inside the closed ring;

measuring a property of the substrate while the substrate is mounted on the mounting frame; and physically processing the optical surface of the substrate while the substrate is mounted on the mounting frame such that the optical surface is modified by said processing.

19. The method of claim 18, wherein said mounting the substrate on the mounting frame comprises mounting the substrate on the mounting frame via plural attachment members, the attachment members being attachable to the substrate.

20. The method of claim 18, wherein the mounting frame is configured to support the substrate in an optical system for which the optical component is designed.

21. The method of claim 18, wherein the closed ring has a circular shape.

22. The method of claim 18, wherein the support member comprises a continuous member that supports the plural attachment members.

23. A method of manufacturing an optical component, the optical component comprising a substrate and a mounting frame for mounting the substrate, the substrate having an optical surface, the method comprising:

mounting the substrate on the mounting frame such that a contact between the substrate and the mounting frame extends over a substantially continuous peripheral region near a periphery of the substrate, the mounting frame having a structure of a closed ring;

measuring a property of the substrate while the substrate is mounted on the mounting frame, the substrate being arranged such that an optical axis of the substrate is positioned inside the closed ring; and physically processing the optical surface of the substrate while the substrate is mounted on the mounting frame such that the optical surface is modified by said processing.

24. The method of claim 23, wherein the mounting frame is configured to support the substrate in an optical system for which the optical component is designed.

* * * * *